United States Patent
Hasei

(10) Patent No.: US 7,037,833 B2
(45) Date of Patent: May 2, 2006

(54) PATTERN FORMING METHOD, FILM STRUCTURE, ELECTRO-OPTICAL APPARATUS, AND ELECTRONIC DEVICE

(75) Inventor: Hironori Hasei, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/927,072

(22) Filed: Aug. 27, 2004

(65) Prior Publication Data
US 2005/0106775 A1 May 19, 2005

(30) Foreign Application Priority Data
Sep. 11, 2003 (JP) ............................. 2003-320159

(51) Int. Cl.
*H01L 21/44* (2006.01)
(52) U.S. Cl. ..................................... 438/674
(58) Field of Classification Search ............... 438/6, 438/11, 16, 115, 663, 680, 723, 716, 770, 438/773, 778, 787, 795; 156/345, 346; 356/72, 356/437
See application file for complete search history.

(56) References Cited

U.S. PATENT DOCUMENTS

| | | | | |
|---|---|---|---|---|
| 5,707,684 A | * | 1/1998 | Hayes et al. | 427/162 |
| 6,419,746 B1 | * | 7/2002 | Banno et al. | 118/323 |
| 6,503,831 B1 | * | 1/2003 | Speakman | 438/674 |

FOREIGN PATENT DOCUMENTS

JP       A 7-120611       5/1995

* cited by examiner

*Primary Examiner*—Michael Lebentritt
*Assistant Examiner*—Andre' Stevenson
(74) *Attorney, Agent, or Firm*—Oliff & Berridge, PLC

(57) ABSTRACT

Exemplary embodiments of the present invention provide a pattern forming method that secures sufficient alignment accuracy when a pattern is formed by droplet ejection. Exemplary embodiments provide a pattern on a substrate by placing a liquid material including a pattern forming material onto the substrate by droplet ejection, including placement of the liquid material including an alignment mark forming material, onto the substrate by the droplet ejection prior to forming the pattern; and placement of the pattern forming material by making use of a placed alignment mark.

8 Claims, 5 Drawing Sheets

PATTERN FORMING METHOD, FILM STRUCTURE, ELECTRO-OPTICAL APPARATUS, AND ELECTRONIC DEVICE

BACKGROUND OF THE INVENTION

1. Field of Invention

The present invention relates to a method of forming a pattern on a substrate by droplet ejection, and especially to alignment technology to enhance or improve pattern placement accuracy.

2. Description of Related Art

The related art includes a method to form a pattern such as a color filter and so forth on a substrate; a bank is formed by photolithography technique on the substrate to function as a partition wall between filter elements, and then a material film to form the pattern is formed in an area surrounded by the bank by droplet ejection, such as inkjet technology. See for example, related art document Japanese Unexamined Patent Publication No. 7-120611.

SUMMARY OF THE INVENTION

Droplet ejection technology of the related art is used for a wiring method for electronic devices.

In the wiring method, a liquid repellency treatment is implemented at first for any other substrate surface area except an area of wiring forming. Then, a liquid material to form wiring is ejected onto the area for which liquid repellency treatment is not implemented. Afterwards, the liquid material is dried or baked to form wiring.

However, in the related art method, for example when wiring is formed as laminated films, there exists a problem that alignment between the films to be laminated becomes poor. Accordingly, in a method to form a pattern by using a bank, when the bank is formed by using a photo-resist, an alignment mark can be formed at the same time by using the photo-resist. On the other hand, in a method where an area of wiring forming is controlled by surface treatment for the substrate, such an alignment mark cannot be formed. Thus, when there exists no structure on the substrate (namely, there is no datum object), namely for example, when wiring of a bottom layer is formed, sufficient pattern accuracy cannot be obtained.

Incidentally, while following the related art method described above, it is also possible to form only an alignment mark by photolithography technique before wiring drawing. However, this method wastefully consumes much material, and separately requires exposure and developer equipment so that the entire manufacturing system becomes a large-scale structure.

Exemplary embodiments of the present invention have been developed to solve the above discussed and/or other problems, and includes a pattern forming method that secures sufficient alignment accuracy when a pattern is formed by droplet ejection. In addition, exemplary embodiments of the present invention also include a film structure including a pattern formed by the method, and an electro-optical apparatus and/or an electronic device including such a film structure.

In order to address the above discussed and/or other problems, a pattern forming method of exemplary embodiments of the present invention is a method of forming a pattern as required on a substrate, by placing a liquid material including a pattern forming material onto the substrate by droplet ejection, including: placement of the liquid material including an alignment mark forming material onto the substrate by droplet ejection prior to forming the pattern; and placement of the pattern forming material by making use of a placed alignment mark.

According to this exemplary method, an alignment mark that functions as a datum for positioning in forming a pattern is formed by droplet ejection in the same manner as the pattern is formed. Being compared with forming an alignment mark by photolithography technique in following the related art method, this method makes it possible to enhance or improve alignment accuracy in an easier manner. While not only the objective pattern but also any other auxiliary pattern such as an alignment mark and so on, which becomes necessary in a process of manufacturing a device, are formed by droplet ejection; it also become possible to form the entire device by droplet ejection. In other words, this method gives significance to the point that the method itself becomes a constituent technology for materialization of the device manufacturing process with an entire wet process.

In the exemplary method, it is preferable that the alignment mark forming material and the pattern forming material are of the same material. According to this setup, the manufacturing process becomes easier and any process contamination can also be avoided.

Incidentally, the exemplary method described above is especially effective when the pattern is formed without any structure such as a bank and so on, for example, when the pattern is composed of a wiring pattern.

Furthermore, a pattern forming method of exemplary embodiments of the present invention is a method of forming a pattern composed of a laminated film of multiple kinds of pattern forming materials on a substrate by laminating a liquid material including the various kinds of pattern forming materials onto the substrate droplet ejection, including placing a liquid material including an alignment mark forming material, onto the substrate by the droplet ejection at least prior to a placement process of a second layer of a pattern forming material; and placement of the second and subsequent layers of the pattern forming materials by making use of a placed alignment mark.

In this exemplary method, the same pattern is repeatedly drawn with multiple kinds of liquid materials in an overlap manner. When a pattern is formed with laminated films, alignment of the films to be laminated is an important factor. Eventually, if an alignment mark is formed by droplet ejection before forming the pattern as this exemplary method proposes, it becomes possible to form a laminated pattern with good alignment accuracy in an easier manner.

In the case of a laminated-type pattern, it is preferable that a material having the highest adhesiveness to the substrate among the multiple kinds of pattern forming materials is positioned so as to be closest to the substrate.

If a layer for the purpose of providing adhesiveness (an intermediate layer) is placed as a first layer, the pattern can be formed with good adhesiveness to the substrate and becomes resistant to having any defect, such as peeling-off and so on.

In the case of such a laminated-type pattern, it is preferable that the pattern is a wiring pattern including laminated films of two kinds of pattern forming materials, in which a pattern forming material of a first layer positioned closer to the substrate side includes at least one of metal particles of manganese, chrome, nickel, titanium, magnesium, silicon, and vanadium; and particles containing oxide of the metal materials described. A pattern forming material of a second layer includes at least one of metal particles of gold, silver, copper, palladium and nickel; and particles containing alloy of the metal materials described above. Accordingly, wiring can be formed with good adhesiveness to the substrate and with low resistance.

Incidentally, the alignment mark described above is used for the purpose of aligning the films to be laminated, and furthermore it can also be used for other purposes, for example, such as positioning work as well as leveling work and so on, at the time of installing a substrate into droplet ejection equipment. However, in the case where such positioning work and so on for the substrate are not required, the alignment mark can be formed at the same time when the first layer is formed (namely, before forming the second layer). In other words, the same material as for the pattern forming material of the first layer positioned closest to the substrate side is used for the alignment mark forming material; and placement of the alignment mark forming material. Further, placement of the pattern forming material of the first layer are implemented together in one manufacturing process. In this case, the manufacturing process becomes easier and any process contamination can also be avoided.

In the pattern forming method described above, it is preferred that any other substrate surface area except the area of pattern forming is controlled by surface treatment before forming the pattern so as to exhibit liquid repellency against a liquid material including the pattern forming material. Here, the "liquid repellency" generally means a property that shows non-affinity against the liquid material.

If the substrate surface is made to be liquid-repellent in the manner described above, dispersion of the liquid material placed on the substrate is controlled to enable making the wiring pattern finer.

A film structure of exemplary embodiments of the present invention includes a pattern formed by any of the methods described above. In the film structure, alignment of the pattern can be implemented with good accuracy so that it becomes possible to increase the density of the pattern. Furthermore, since the alignment mark is formed by droplet ejection, the film structure can be formed inexpensively.

An electro-optical apparatus of exemplary embodiments of the present invention includes a film structure described above. Electro-optical apparatus includes, for example, a liquid crystal display device, an organic electroluminescent display device, a plasma display panel device, and so on. In addition, an electronic device of exemplary embodiments of the present invention includes an electro-optical apparatus described above.

According to this structure, it is possible to inexpensively provide such an electro-optical apparatus and an electronic device of high quality.

DETAILED DESCRIPTION OF PREFERRED EMBODIMENTS

The following sections explain a method of forming conductive film wiring on a substrate as an example of a pattern forming method of exemplary embodiments of the present invention.

Figure 1:
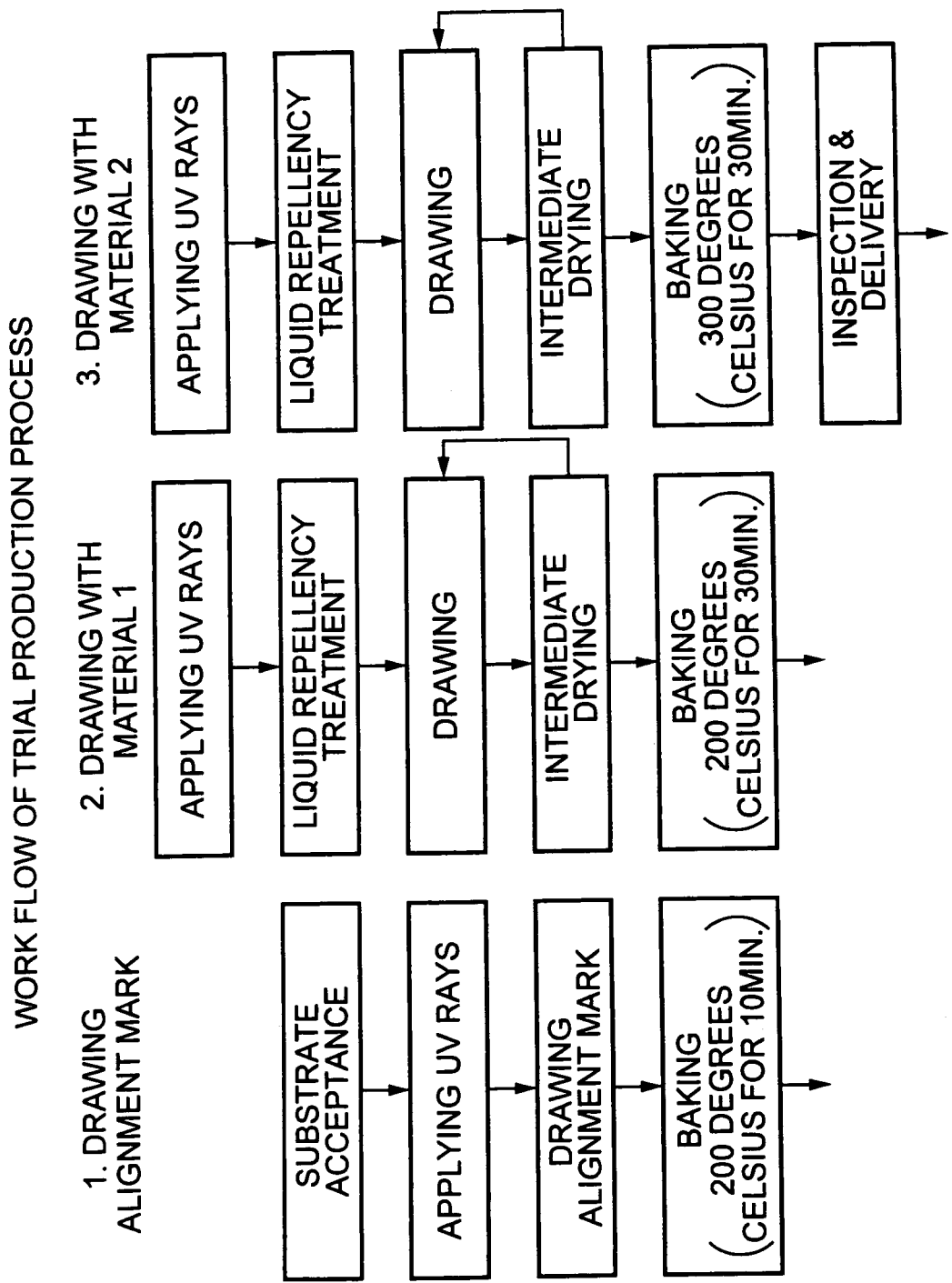
FIG. 1 is a schematic showing a process workflow that describes an example of a pattern forming method of an exemplary embodiment of the present invention.

FIG. 1 shows a flowchart describing a forming process of conductive film wiring of exemplary embodiments of the present invention.

In a wiring forming method of this exemplary embodiment, a liquid material is placed onto a substrate by droplet ejection in order to form a wiring pattern on the substrate. According to this exemplary embodiment, the same pattern is repeatedly drawn with multiple kinds of liquid materials in an overlap manner to enhance or improve the wiring's adhesiveness to the substrate so that the wiring is formed as laminated films of multiple kinds of pattern forming materials (in this example, as a two-layer structure composed of an intermediate layer and a conductive layer that becomes a wiring main body). That is to say, this wiring forming method includes an intermediate layer forming process and a material placement process to form the conductive layer that becomes a wiring main body. Thus, the intermediate layer forming process is a process to form the intermediate layer that is positioned between the substrate and the wiring main body, wherein the intermediate layer assumes the role of enhancing or improving the wiring main body's adhesiveness to the substrate. Then, the film structure (conductive thin film) of exemplary embodiments of the present invention include the intermediate layer and the conductive layer that becomes the wiring main body.

In this exemplary embodiment, an alignment mark is formed on the substrate prior to forming the wiring pattern (alignment mark forming process), in order to avoid any displacement between the intermediate layer and the wiring main body that is formed on the intermediate layer. Forming the alignment mark is materialized by placing a liquid material on the substrate by droplet ejection in the same manner as the wiring pattern is formed.

Incidentally, the alignment mark is used not only for the purpose of avoiding any displacement between the laminated-layer patterns but also for other purposes, for example, such as positioning work as well as leveling work and so on at the time of installing the substrate into droplet ejection equipment.

At first, liquid materials to be used in the alignment mark forming process, the material placement process and the intermediate layer forming process are explained.

In these processes, each specific liquid material is placed on the substrate. Namely, in the material placement process, a liquid material including a first kind of metal particle to form the conductive film wiring (first liquid material) is used as a pattern forming material. Meanwhile, in the intermediate layer forming process, another liquid material (second liquid material) different from the first liquid material is used. Then, in the alignment mark forming process, the same material as the pattern forming material to be used either in the material placement process or in the intermediate layer forming process is used as an alignment mark forming material in order to make the manufacturing work easier and avoid any contamination.

For placement operation of these liquid materials; a liquid ejection method so-called the inkjet method, in which a liquid material is ejected as a droplet through a nozzle of a droplet ejection head, is used.

As a liquid material to be used in the material placement process, a dispersion liquid containing a metal particle in a dispersion solvent is used in this example. A conductive particle to be used in this case (first metal particle) is a metal particle including at least one of silver, gold, copper, palladium and nickel, or an alloy particle including at least one of these metals.

These metal particles are coated with a film of an organic substance and so on (coating material) to enhance or improve dispersion performance.

The size of the conductive particle is preferably greater than 1 mn and smaller than 0.1 micrometer. If the size is greater than 0.1 micrometer, the nozzle of the droplet ejection head may have a chance to get clogged. On the other hand, if the size is smaller than 1 nm, some problems arise, for example, dispersion performance of the metal particle become worse and/or the volume ratio of the coating material in comparison with the metal particle becomes so great that the ratio of the organic substance in the film to be obtained becomes excessively great.

As for the dispersion solvent of the liquid containing the metal particle, its vapor pressure at room temperature is preferably higher than 0.001 mmHg and lower than 200 mmHg (approximately higher than 0.133 Pa and lower than 26,600 Pa). If the vapor pressure is higher than 200 mmHg, the dispersion solvent gets vaporized so rapidly after ejection that it is difficult to form a film of good quality.

Moreover, it is still further preferred that the vapor pressure of the dispersion solvent is higher than 0.001 mmHg and lower than 50 mmHg (approximately higher than 0.133 Pa and lower than 6,650 Pa). If the vapor pressure is higher than 50 mmHg, the nozzle is likely to get clogged easily due to dryness when a droplet is ejected by the inkjet method, and eventually it becomes difficult to stably eject the liquid.

In the case of any dispersion solvent whose vapor pressure at room temperature is lower than 0.001 mmHg, drying operation is slow so that the dispersion solvent is likely to remain in the film and a conductive film of good quality is difficult to obtain after thermal treatment and/or optical treatment to be implemented in a baking process (heating process) in the material placement process.

As for the dispersion solvent, there is no specific restriction except for a dispersion solvent that can disperse the conductive particle and does not cause cohesion. What can work as the dispersion solvent is water as well as some alcohol materials such as methanol, ethanol, propanol, butanol, and so on; some hydrocarbon compounds such as n-heptane, n-octane, decane, toluene, xylene, cymene, durene, indene, di-pentene, tetra-hydro-naphthalene, deca-hydro-naphthalene, cyclo-hexyl-benzene, and so on; some ether compounds such as ethylene-glycol-dimethyl-ether, ethylene-glycol-diethyl-ether, ethylene-glycol-methyl-ethyl-ether, diethylene-glycol-dimethyl diethylene-glycol-methyl-ethyl-ether, 1,2-dimethoxyetliane, bis-(2-methoxyethyl)ether, p-dioxane, and so on; as well as some polar compounds such as propylene-carbonate, γ-butyrolactone, N-methl-2-pyrrolidone, dimethyl-formamide, dimethyl-sulfoxide, cyclo-hexanone, and so on. Among those materials, water, alcohol materials, hydrocarbon compounds, and ether compounds are preferred from the viewpoint of dispersion performance of the particle, stability of the dispersion liquid, and fitness for the inkjet method. Then, as further preferred dispersion solvents, water and hydrocarbon compounds can be listed. Any of these dispersion solvents can be used alone as a single component, and can also be used as a mixture of two or more substances while being mixed.

When the conductive particle is dispersed in a dispersion solvent, concentration of the dispersed substance is more than 1 weight-percent and less than 80 wt. percent, and the concentration can be adjusted according to the required thickness of the conductive film. If the concentration is more than 80 wt. percent, cohesion may be easily caused and it may become difficult to obtain a uniform film.

Surface tension of the dispersion liquid of the conductive particle is preferably within the range from 0.02 N/m to 0.07 N/m. If the surface tension is less than 0.02 N/m when the liquid is ejected by the inkjet method, wet-ability of the ink composition for the nozzle surface increases so that a bend of the flying path of the liquid may be caused. Meanwhile, if the surface tension exceeds 0.07 N/m, the meniscus form of the liquid at the nozzle tip is unstable and therefore it becomes difficult to control the ejection amount and the ejection timing.

To control the surface tension, it is recommended to add a small amount of surface tension control agent of fluorine-base, silicone-base, nonionic-base, and so on, to the dispersion liquid so the angle of contact to the substrate is not inadequately deteriorated. The nonionic-base surface tension control agent enhances or improves wet-ability of the liquid for the substrate as well as leveling performance of the film, and it is also effective for reducing or preventing minute unevenness of the film from arising.

The dispersion liquid may contain some organic material such as alcohol, ether, ester, ketone, and so on, as required.

Viscosity of the dispersion liquid is preferably within the range from 1 mPa-s to 50 mPa-s. If the viscosity is less than 1 mPa-s when the liquid is ejected by the inkjet method, the nozzle circumference area is likely to get contaminated by ink leakage. Meanwhile, if the viscosity is greater than 50 mPa-s, a nozzle hole may be clogged frequently and smooth droplet ejection becomes difficult.

As a liquid material to be used in the intermediate layer forming process, a dispersion liquid containing a metal particle in a dispersion solvent is used in this example. As a conductive particle to be used in this case (second metal particle) a conductive particle having a function to enhance or improve the bonding performance of the first metal particle described above and the substrate through a baking process of the material placement process to be described later, is used. Then, the particle may be either conductive or non-conductive. The particle to be used is what contains, for example, at least one of manganese, copper, chrome, nickel, titanium, magnesium, silicon, vanadium, and alloys as well as oxides of the above materials. Furthermore, the liquid material may contain an organic metal compound of the metal materials described above.

The size of the metal particle to be used in the intermediate layer forming process is preferably greater than 1 nm and smaller than 0.1 micrometer. If the size is greater than 0.1 micrometer, the nozzle of the droplet ejection head may have a chance to get clogged.

Then, as a liquid material to be used in the alignment mark forming process, a dispersion liquid containing the same metal particle as the first metal particle or the second metal particle (alignment mark forming material) in a dispersion solvent is used as already described.

As a dispersion solvent of the liquid containing the metal particle to be used in the intermediate layer forming process and the alignment mark forming process, the same as the dispersion solvent for the metal particle to be used in the material placement process can be used. Therefore, descriptions on the dispersion solvent are omitted here. Regarding concentration of the dispersed substance in the case of dispersing the particle in the dispersing solvent, the same descriptions can also be applied. Moreover, as for surface tension as well as additives, also the same descriptions can be applied, and therefore descriptions on those issues are omitted here.

Next, each of the processes described above is explained in detail.

(Alignment Mark Forming Process)

The alignment mark forming process includes: a drawing process in which a liquid material is placed onto a substrate to form conductive film wiring on it, and a baking process (heating process) in which the dissolving substance (dispersion solvent) included in the liquid material placed onto the substrate is dried out for removal.

As the substrate for the conductive film wiring, various materials such as a Si wafer, quartz glass, glass, a plastic film, a metal plate, and so on, can be used. It is also possible to use another type of material, in which a semiconductor film, a metal film, a dielectric film, an organic film and so on are formed as a foundation layer on a base substrate surface of various raw materials mentioned above, as a substrate on which the conductive film wiring is formed.

In the drawing process, while a droplet ejection head being in relative movement to the substrate, a liquid material containing the alignment mark forming material described above is placed onto a spot other than the area of wiring forming. As a form of the alignment mark, any publicly known form such as a circle, a cross, and so on, can be adopted. Incidentally, in this first process, a pretreatment such as UV cleaning and so on is carried out for the substrate as required.

In the baking process, heating is applied to remove the dispersion solvent included in the liquid material placed on the substrate so as to change the liquid material into a dry film. A heating condition in this process is to fully vaporize the dispersion solvent, and it is not needed to heat up the liquid material excessively so as to dissolve the coating material for the metal particle described above. Since the alignment mark, the intermediate layer, and the conductive layer that become the wiring main body are collectively baked in a baking process of the material placement process as described later (i.e., heating in the process is applied to fully dissolve and remove the coating material in order to make multiple metal particles contact each other or change them into a metal film by sintering), it is expected in the alignment mark forming process only to vaporize the dispersion solvent. In this manner, the baking process in the halfway working stage is simply carried out as a temporary baking operation so that the total operation time of the entire wiring forming process can be shortened.

Therefore, the substrate treatment temperature in this baking process is higher than the boiling point of the dispersion solvent and lower than the dissolving temperature of the coating material (Namely, the substrate treatment temperature is 200 degrees Celsius, for example), and the substrate is heated at this treatment temperature for about 10 minutes.

For the purpose of removing the dispersion solvent, a lamp anneal method may also be adopted, in addition to an ordinary heat treatment method using heating measures such as a hot plate, an electric furnace, a hot blast generator and so on.

(Intermediate Layer Forming Process)

The intermediate layer forming process includes: a surface treatment process in which any other substrate surface area except an area of wiring forming on the substrate is made to be liquid-repellent; a drawing process in which a liquid material is placed onto the substrate made to be liquid-repellent; an intermediate drying process in which the liquid material placed on the substrate is dried at a low temperature; and a baking process (heating process) in which the solvent included in the liquid material is dried out and removed by heating at a high temperature.

In the surface treatment process, the substrate surface area is made to be liquid-repellent against the liquid material to be used in the drawing process. Concretely to describe, the surface treatment is implemented to make the specified angle of contact to the liquid material more than 30 degrees and less than 60 degrees. Incidentally, in this surface treatment process, a pretreatment such as UV cleaning and so on is carried out for the substrate as required.

As a method of controlling the liquid repellency (wetability) on the surface, some application can be adopted, such as a method in which a self assembled mono-layer is formed, a plasma treatment method, and so on.

In the self assembled mono-layer forming method, a self assembled mono-layer composed of an organic molecular film and so forth is formed on a substrate surface on which conductive film wiring is to be formed.

The organic molecular film for the substrate surface treatment includes: a functional group that can connect with the substrate; another functional group that is positioned opposite to the first one, and is a liquid-affinity functional group or a liquid-repellent functional group, for example, to change the substrate surface quality (to control the surface energy); and a carbon straight-chain or a carbon chain branched partially that combines the above functional groups. The organic molecular film connects with the substrate and self-assembles to form a molecular film such as a mono-molecular layer for example.

The "self assembled mono-layer" here means a film including a connectable functional group that can react with a structural atom of a foundation layer such as a substrate, and another straight-chain molecule; the film being formed by orienting a compound provided with an extremely high directing property, by making use of an interaction of the direct-chain molecule. As being formed by orienting a mono-molecule, the self assembled mono-layer can make its film thickness extremely thin, and it becomes a layer that is uniform on a molecular level. That is to say, since the same molecule is positioned on the layer surface, uniform and excellent liquid-repellency or liquid-affinity can be provided for the layer surface.

By using fluoro-alkyl-silane, for example, as a compound having a high directing property described above, each compound is oriented to position a fluoro-alkyl group and form a self assembled mono-layer on the layer surface so that uniform liquid liquid-repellency is provided for the layer surface.

Chemical compounds to form a self assembled mono-layer include various fluoro-alkyl-silane compounds (hereinafter called "FAS"); such as heptadeca-fluoro 1,1,2,2 tetrahydro-decyl-tri-ethoxysilane, heptadeca-fluoro 1,1,2,2 tetrahydro-decyl-tri-methoxysilane, heptadeca-fluoro 1,1,2,2 tetrahydro-de 1,2,2 tetrahydro-octyl-tri-ethoxysilane, trideca-fluoro 1,1,2,2 tetrahydro-octyl-tri-methoxysile trideca-fluoro 1,1,2,2 tetrahydro-octyl-tri-chlorosilane, trifluoro-propyl-tri-methoxysilane, and so on. When being used, any of these chemical compounds can be used alone as a single component, and can also be used as a mixture of two or more components while being mixed. Then, using such an FAS makes it possible to obtain close contact with the substrate and good liquid-repellency.

In general, an FAS can be expressed with a structural formula of $RnSiX_{(4-n)}$; wherein "n" is an integer in the range from 1 to 3, and "X" is a hydrolysis group such as a methoxy group, an ethoxy group, a halogen atomic, and so on. In addition, "R" is a fluoro-allkyl group, and is provided with its structure of $(CF_3)(CF_2)x(CH_2)y$(wherein "x" is an integer in the range from 0 to 10, and "y" is an integer in the range from 0 to 4). If a plurality of "R"s and/or "X"s are combined with "Si", those "R"s and the "X"s can be either identical or different each other in their set of the "R"s or the "X"s. The hydrolysis group expressed with "X" forms silanol by hydrolysis and reacts with a hydroxyl of the foundation of the substrate (glass or silicone) and so on to connect with the substrate by siloxane bonding. Meanwhile, since the "R" is provided with a fluoro group such as $(CF_3)$ and so forth on the surface, it modifies the foundation surface of the substrate and so on to be a wet-free surface (the surface energy is low).

A self assembled mono-layer composed of an organic molecular film and so forth is formed by storing such a chemical compound described above as a raw material together with a substrate in an airtight container. In the case of keeping them at room temperature, storing for 2–3 days makes up the self assembled mono-layer on the substrate. Then, if the entire airtight container is kept at 100 degrees Celsius, storing for around 3 hours forms the self assembled mono-layer on the substrate. What is described above is a forming method in a vapor phase, and it is also possible to form a self assembled mono-layer in a liquid phase. For example, a self assembled mono-layer can be obtained on a substrate by soaking the substrate in a solution containing a chemical compound as a raw material, and then washing and drying the substrate.

Incidentally, it is preferable before forming a self assembled mono-layer to carry out pretreatment by applying UV rays onto the substrate surface or washing the substrate with solvent.

In the plasma treatment method, plasma is applied onto a substrate under either normal pressure condition or vacuum condition. The type of gas to be used for plasma treatment can be chosen among various types while the surface material of the substrate, on which conductive film wiring is formed, and other conditions are to be taken into consideration. As a gas for plasma treatment, for example, 4-fluoromethane, perfluoro-hexane, perfluoro-decane, and so on can be listed.

Furthermore, making the substrate surface liquid-repellent can also be implemented by applying a film provided with liquid repellency as required, for example a polyimide film processed with 4-fluoroethylene and so forth, onto the substrate surface. Moreover, it is also possible to use such a polyimide film described above as a substrate as it is.

If the substrate surface is more liquid-repellent than the expected liquid repellency, it is recommended to control condition of the substrate surface by applying UV rays with wavelength of 170 to 400 nm, or exposing the substrate in an ozone environment for the purpose of making the substrate surface liquid-affinitive.

Figure 2A:
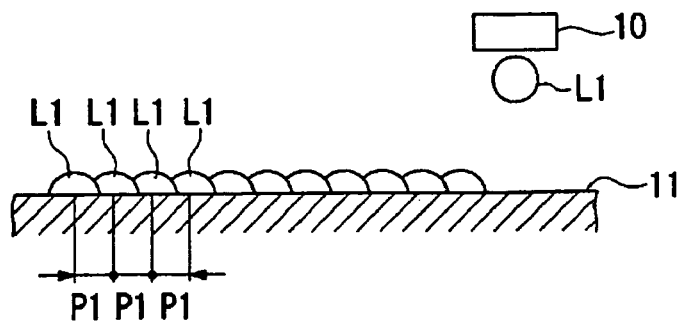
FIGS. 2A–B are schematics showing an example of procedures of forming an intermediate layer on a substrate.
Figure 2B:
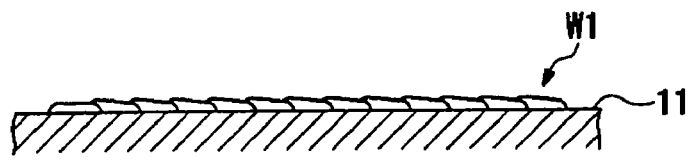

Next, the drawing process is explained. FIG. 2a and FIG. 2b graphically show a sample case of procedures of forming an intermediate layer on a substrate.

As already described above, this intermediate layer is placed for the purpose of enhancing or improving the conductive film wiring's adhesiveness to the substrate.

In the drawing process, while a droplet ejection head 10 being in relative movement to a substrate 11 as shown in FIG. 2A, a liquid material to form the intermediate layer is ejected by the droplet ejection head 10 as a plurality of droplets L1, which are arranged on the substrate 11 at constant intervals (pitch P1).

In this example, the arrangement pitch P1 of the droplets L1 is set to be less than the diameter of each of the droplets L1 that the droplet has, just after being placed onto the substrate 11. According to this arrangement, the droplets L1, just after being placed onto the substrate 11, are overlapped each other to form a continuous line W1. Meanwhile, the substrate 11 is provided with surface treatment to have the angle of contact in the range of 30 degrees to 60 degrees to the liquid material. Therefore, if the overlap of the droplets is excessively large, the liquid of the material formed into the continuous line easily moves inside the line to form a swell called "bulge", while the other part becomes thin and eventually makes the line discontinuous. This is needed to make the overlap of the droplets in the range from 1 to 10 percent of the diameter of each of the droplets that the droplet has, at the time of being placed onto the substrate 11.

Then, such placement of the droplets is implemented all over the substrate surface to form a film having a pattern on the substrate 11 as required. The pattern of the film is the same or similar as the wiring pattern of the conductive film wiring.

Furthermore, as described later regarding the material placement process, it is also possible to make the arrangement pitch of the droplets greater than the diameter of each of the droplets that the droplet has, just after being placed onto the substrate. In such a case, droplet placement operation is repeated several times for the same section after having an intermediate drying process in the course of placement, while displacing the start point of droplet placement operation, so that a continuous line is formed.

Conditions of droplet ejection, especially regarding the volume of each of the droplets and the arrangement pitch of the droplets, are so specified as to keep the edge form of the line formed on the substrate 11 in good condition with less bumps and dips. Incidentally, since the surface of the substrate 11 is processed in advance to be liquid-repellent, each of the droplets placed on the substrate 11 is restrained from spreading.

Figure 3:
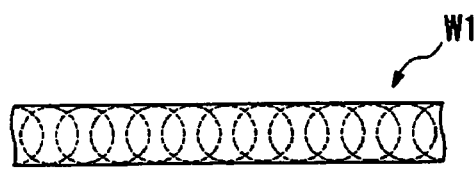
FIG. 3 is a schematic plan view showing a linear line as an example of a film for an intermediate layer formed on a substrate.

FIG. 3 is a schematic plan view of a straight line as an example of a film for an intermediate layer formed on a substrate. As described above, the continuous line W1 can be formed on the substrate 11 by placing a plurality of droplets onto the substrate 11 repeatedly.

Figure 4:
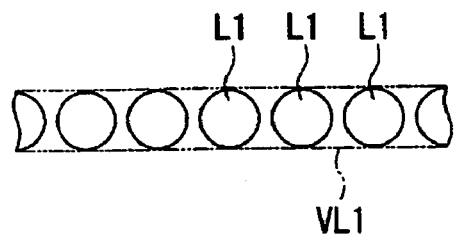
FIG. 4 is a schematic plan view showing an intermittent line as an example of a film for an intermediate layer formed on a substrate.

Incidentally, a film for an intermediate layer does not necessarily need to be a continuous line. For example, as shown in FIG. 4, each of the plurality of droplets L1 may separately be placed with each interval clearance on a virtual line VL1 to form conductive film wiring so as to make the film for an intermediate layer in an intermittent condition.

Furthermore, thickness of the film for an intermediate layer may be thinner than that of the film for conductive film wiring to be described later.

In the intermediate drying process shown in FIG. 2B to be referred to again, the dispersion solvent contained in the liquid material placed on the substrate 11 is partially removed. In this process, the substrate is kept under the condition of room temperature (around 25 degrees Celsius) or a lower temperature of some ten degrees for a few minutes. As a result of such treatment of the process, most of the dispersion solvent contained in the liquid materials is removed. Then, such treatment can also be carried out simultaneously with ejection of the liquid material. For example, by heating the substrate in advance, or by cooling the droplet ejection head while using a dispersion solvent having a low boiling point, as soon as a droplet is placed on the substrate, drying operation of the droplet can begin.

In the baking process, the substrate is heated at a temperature higher than the treatment temperature of the intermediate drying process described above to sufficiently remove the dispersion solvent contained in the liquid material and convert the liquid material into a dry film. A heating condition in this process is to vaporize the dispersion solvent, and it is not needed to heat up the substrate excessively so as to dissolve the coating material for the metal particle described above. Since the second metal particle included in the intermediate layer is collectively baked together with the first metal particle to be formed on this second metal particle in a baking process of the material placement process as described later, it is expected in the intermediate layer forming process, to only vaporize the dispersion solvent. According to this setup, the treatment time can be shortened.

Therefore, the substrate treatment temperature in this baking process, is higher than the boiling point of the dispersion solvent and lower than the dissolving temperature of the coating material (namely, the substrate treatment temperature is 200 degrees Celsius, for example), and the substrate is heated at this treatment temperature for about 30 minutes. For the purpose of removing the dispersion solvent, a lamp anneal method may also be adopted, in addition to an ordinary heat treatment method using heating measures such as a hot plate, an electric furnace, a hot blast generator, and so on.

Incidentally, such a heat treatment for the substrate at a high temperature as described above brings back the condition of the substrate surface as it was before the surface treatment process. For example, if an FAS film is formed on the substrate in the surface treatment process described above, the FAS film gets dissolved and removed by the heat treatment around at 200 degrees Celsius.

(Material Placement Process)

The material placement process includes: a surface treatment process in which any other substrate surface area except an area of wiring forming on the substrate, is made to be liquid-repellent; a drawing process in which a liquid material is placed onto the substrate made to be liquid-repellent; an intermediate drying process in which the liquid material placed on the substrate is dried at a low temperature; and a baking process (heating process) in which the solvent included in the liquid material is dried out and removed by heating at a high temperature.

As described above, the baking process brings back the condition of the substrate surface as it was before the surface treatment process. Therefore, before drawing with the liquid material, it is needed to make the substrate surface liquid-repellent again. Since the surface treatment process in this stage is the same as that of the intermediate layer forming process described above, and therefore descriptions are omitted here. Incidentally, in this surface treatment process, a pretreatment such as UV cleaning and so on is carried out for the substrate as required.

Figure 5A:
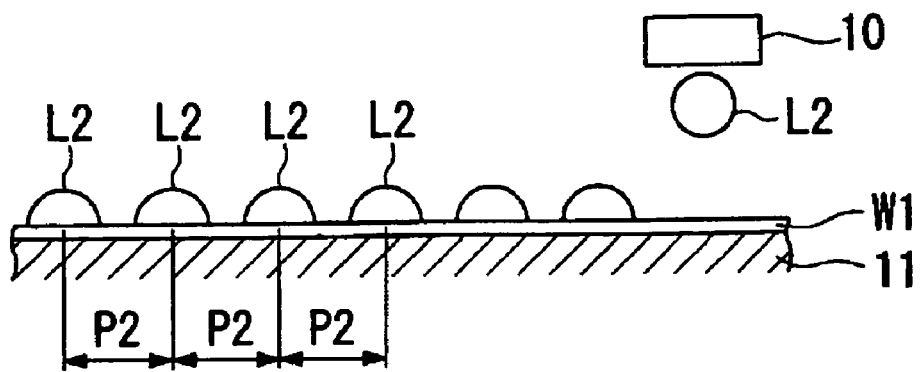
FIGS. 5A–C are schematics showing a process of placing a liquid material onto a substrate.
Figure 5B:
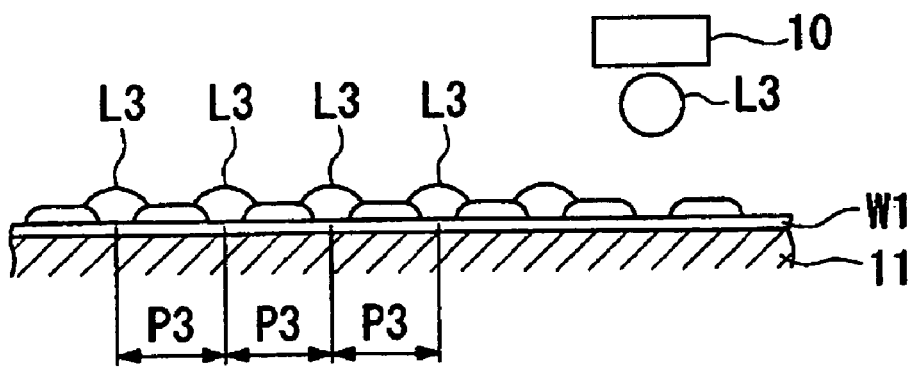
Figure 5C:
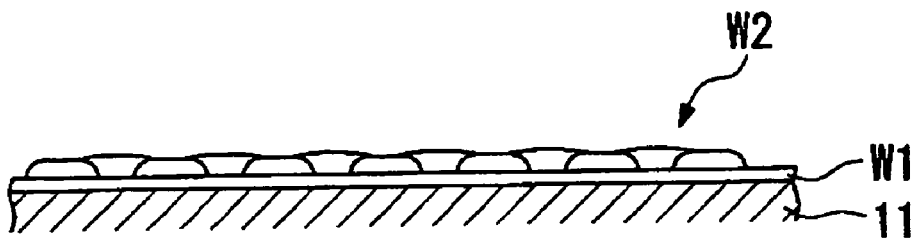

In the drawing process, the first liquid material, which becomes a wiring main body, is placed by the droplet ejection head onto the film for the intermediate layer formed on the substrate. FIG. 5a through FIG. 5c are drawings to concretely show procedures of placing the liquid material onto the substrate.

In the drawing process; as FIG. 5A shows, a plurality of droplets L2 ejected from the droplet ejection head 10 are placed onto the film for the intermediate layer W1 in due order with each interval clearance. In this example, the arrangement pitch P2 of the droplets L2 is set to be greater than the diameter of each of the droplets L2 that the droplet has, just after being placed onto the substrate 1. Furthermore, the arrangement pitch P2 of the droplets L2 is set to be less than two times of the diameter of each of the droplets L2 that the droplet has, just after being placed onto the substrate 11.

Next, as FIG. 5B shows, after having an intermediate drying process in the course of placement, the droplet placement operation described above is repeated. That is to say, in the same manner as the last procedure as FIG. 5A shows, the liquid materials is ejected from the droplet ejection head 10 as a plurality of droplets L3, which are placed onto the substrate 11 with a constant interval clearance.

In this operation, the volume of each of the droplets L3 (the amount of each droplet of the liquid material) and their arrangement pitch P3 are the same as those of the droplets L2 of the last operation. Furthermore, the arrangement positions of the droplets L3 are shifted from the positions of the droplets L2 of the last operation for a half of the arrangement pitch to place each of the droplets L3 of the operation this time at each middle point of neighboring two of the droplets L2 of the last operation placed on the substrate 11.

As described above, the arrangement pitch P2 of the droplets L2 on the substrate 11 is set to be greater than the diameter of each of the droplets L2 that the droplet has, just after being placed onto the substrate 11 and to be less than two times the diameter. Therefore, while each of the droplets L3 is placed at each middle point of neighboring two of the droplets L2, each of the droplets L3 partially overlaps the droplets L2 so that the space between neighboring two of the droplets L2 is filled up. Consequently, as FIG. 5C shows, a continuous line W2 made of the liquid material of the conductive film wiring is formed on the film for the intermediate layer W1. Such placement of the droplets is implemented all over the substrate surface to form a film for wiring having a pattern on the substrate 11 as required.

Then, as already described, since the surface of the substrate 11 is processed in advance to be liquid-repellent, the liquid material is repelled in any area outside the film for the intermediate layer W1 so as to be placed for sure on the film for the intermediate layer W1. Moreover, since the film for the intermediate layer W1 is somewhat re-dissolving with the dispersion solvent of the liquid material of the conductive film wiring, the film for the intermediate layer W1 has a relatively high affinity with the liquid material. Therefore, the liquid material placed on the film for the intermediate layer W1 gets spread well in wet condition inside the film for the intermediate layer W1. Furthermore, as already described, since the film for the intermediate layer W1 is formed with the same pattern as the wiring body to be formed on the film for the intermediate layer W1, the liquid material spread in wet condition inside the film for the intermediate layer W1 is well arranged to have the wiring pattern as required.

Incidentally, an intermediate drying process is carried out every time after a series of droplet placing operations. Since this intermediate drying process is the same as that of the intermediate layer forming process, description on the process are omitted here.

If the number of repeated operations of droplet placement described above is increased, the droplets are overlapped on the substrate 11 to increase the thickness of the film for the conductive film wiring W2. The film thickness is specified according to a film thickness required for the conductive film wiring in its final condition, and the number of repeated operations of the droplet placement is specified according to this requirement on the final film thickness.

Furthermore, the arrangement pitch of the droplets, the shift amount for repeated operations of droplet placement, and so on can be set optionally. For example, as FIG. 2 shows earlier, it is also possible to eject droplets in such a manner that the droplets, just after being ejected, are partially overlapped each other.

In the baking process, the dispersion solvent and coating material included in the liquid material placed on the substrate are fully removed by heat treatment or optical treatment, and the process is carried out also for the purpose of making multiple metal particles contact each other or sintering them to decrease electric resistance. In this example, a heat treatment for the liquid material of the intermediate layer and that for the liquid material of the conductive film wiring are carried out at the same time.

Ordinarily, the baking process is implemented under an atmospheric environment. However, the baking process can also be carried out under an environment of various inert gases, such as nitrogen, argon, helium, and so on if required. The process temperature of the baking process is adequately specified by taking into consideration various factors such as, the boiling point (vapor pressure) of the dispersion solvent, the type and pressure of the environment gas, the dispersion performance and thermal characteristics such as oxidizing property of the particle, the presence and amount of the coating material, the withstand temperature of the substrate material, and so on.

For example, if a coating material made of an organic material is to be removed, baking at 300 degrees Celsius or higher is usually needed. Therefore, in this example, the heat treatment is carried out by heating the substrate for about 30 minutes at a temperature of 300 degrees Celsius, which is the dissolving temperature of the coating material. Then, if the dissolving temperatures of the coating materials in the pattern forming materials to be used in the drawing processes of both the intermediate layer forming process and the material placement process described above are different from each other, it is needed to set the process temperature in the baking process with the highest one of these dissolving temperatures of the coating materials.

This baking process can be done by ordinary heat treatment measures such as a hot plate, an electric furnace, and so on as well as a lamp anneal method. Regarding a light source to be used in such a lamp anneal method, there is no specific restriction. For example, the light source can include; infrared ray lamps, xenon lamps, YAG laser, argon laser, carbon-oxide gas laser, exima laser such as XeF, XeCl, XeBr, KrF, KrCl, ArF, ArCl, and so on. The light source to be used for the purpose is usually in the output range from 10 W to 5000 W, and for the case of this exemplary embodiment, any such a light source in the output range from 100 W to 1000 W is sufficient.

Through the baking process, electrical contact among the conductive particles contained in the liquid material is secured in the film for the conductive film wiring W2, which is eventually changed into a conductive film. At the same time, the coating material of either the first or second metal particle, formed in the alignment mark forming process and the intermediate layer forming process, is also dissolved and removed so that contained metal particles get sintered to change into a metal film. At this time, the film for the intermediate layer W1 works to enhance or improve bonding condition between the conductive particles for conductive film wiring and the substrate 11 by action of the particles contained in the liquid material.

The conductive film wiring to be formed by this exemplary embodiment can be formed so as to have its width almost the same as the diameter of a droplet of the dispersion liquid that the droplet has, just after being launched onto the substrate. Furthermore, since the bonding condition between the conductive particles contained in the conductive film wiring and the substrate gets enhanced or improved by the metal particles contained in the intermediate layer, the conductive film wiring's adhesiveness to the substrate increases.

According to this exemplary embodiment as described above, it becomes possible to easily form a pattern provided with good alignment accuracy as well as good adhesiveness to the substrate. That is, since the alignment mark is formed by droplet ejection in this exemplary embodiment in the same manner as the pattern is formed, alignment accuracy can be easily enhanced or improved, for example, in comparison with a related art method, in which the alignment mark is formed by photolithography technique. Especially, as described in this exemplary embodiment, when the pattern is formed as a laminated film, accuracy of the alignment between layers to be laminated is so important that the effect of exemplary embodiments of the present invention is significant.

Furthermore, as described in this exemplary embodiment, if not only the objective pattern (i.e., wiring pattern, in this example) but also any other auxiliary pattern such as a alignment mark and so on, which is required by a device manufacturing process, are formed by droplet ejection, it becomes possible to form the entire device by liquid ejection method. In other words, this method gives significance to the point that the method itself becomes a constituent technology for materialization of the device manufacturing process with an entire wet process.

In this exemplary embodiment, a pattern forming material is not baked in each baking process. Instead, in each halfway step of pattern forming, only the dispersion solvent of each corresponding liquid material is simply dried out to form a dry film. Then, in the final baking process, all the dry films are baked and changed into a complete film. Therefore, the processing time of this exemplary embodiment can be shortened in comparison with another method, in which a pattern forming material is sintered (i.e., fully baked) in each baking process.

Next, a plasma display panel is explained, as an example of an electro-optical apparatus of exemplary embodiments of the present invention.

Figure 6:
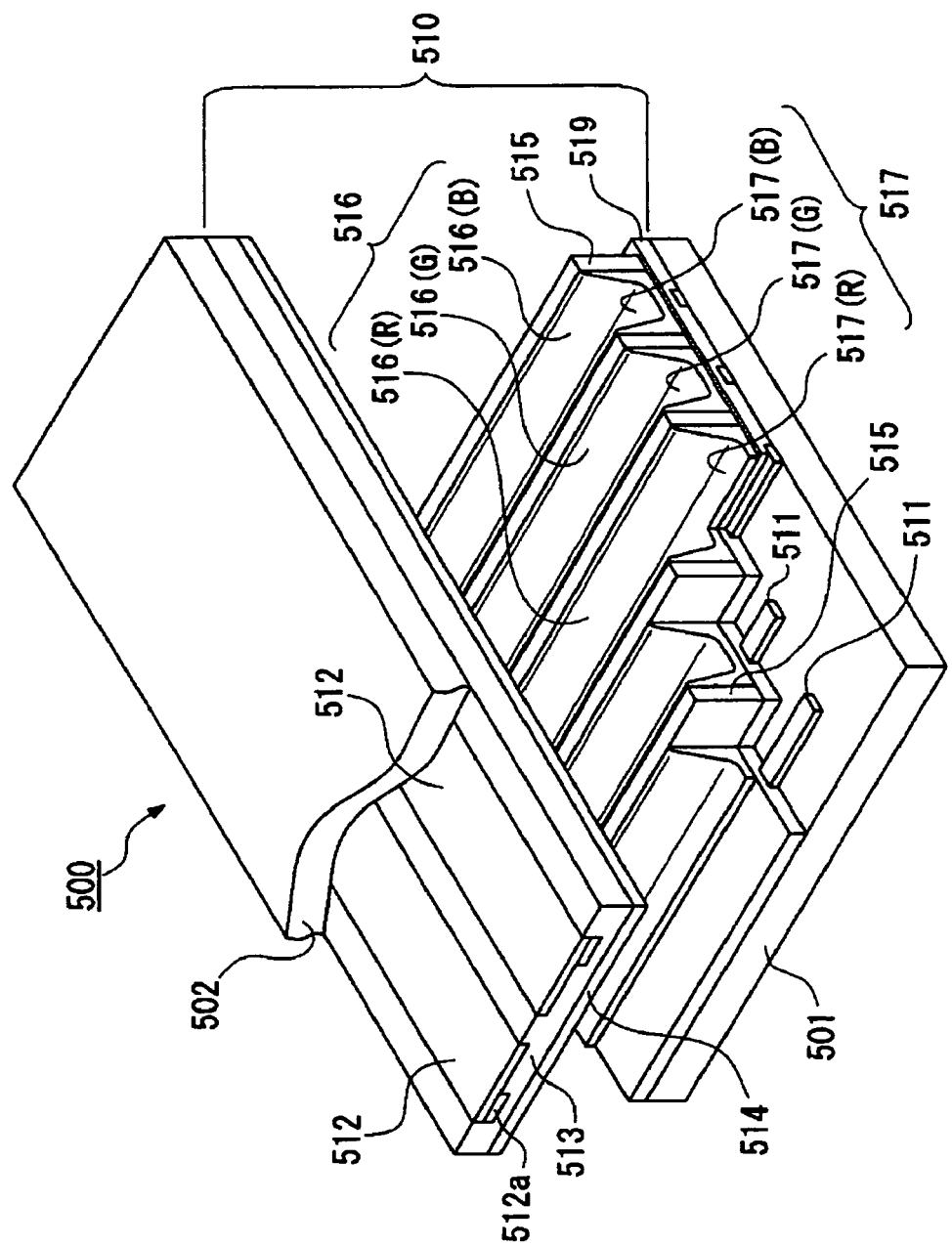
FIG. 6 is a schematic exploded bird's eye view showing an example, in which an electro-optical apparatus of exemplary embodiments of the present invention are applied to a plasma display panel.

FIG. 6 shows a schematic bird's-eye overview of a plasma display panel 500 of this exemplary embodiment in its exploded condition. The plasma display panel 500 includes some parts in its structure, i.e., a first glass substrate 501 and a second glass substrate 502, both of which are arranged in face-to-face condition, as well as a discharge display section 510 formed between the substrates.

On the top surface of the first glass substrate 501, a plurality of address electrodes 511 are formed at regular intervals in stripe condition, and a first dielectric layer 519 is formed to cover the address electrodes 511 and the top surface of the first glass substrate 501. On the first dielectric layer 519, a plurality of partition walls 515 are formed, while each of the partition walls 515 being placed between neighboring two address electrodes 511 and along with each electrode 511. Inside each stripe section partitioned by the partition walls 515, there is placed a fluorescent substance 517. Each fluorescent substance 517 emits one of red fluorescence, green fluorescence, and blue fluorescence. On a bottom section and a sidewall of a red fluorescence discharging chamber 516(R), a red fluorescent substance 517(R) is placed; on a bottom section and a sidewall of a green fluorescence discharging chamber 516(G), a green fluorescent substance 517(G) is placed; and on a bottom section and a sidewall of a blue fluorescence discharging chamber 516(B), a blue fluorescent substance 517(B) is placed.

Meanwhile, at a side of the second glass substrate 502, a plurality of display electrodes 512 made of a transparent conductive film are placed at regular intervals in stripe condition in a direction perpendicular to the address electrodes 511. Furthermore, in order to supplement the display electrodes 512 having high resistance, a bus electrode 512*a* is formed on each of the display electrodes 512. Still further, a second dielectric layer 513 as well as a protection film 514, made of MgO and so on, are formed to cover thereof.

While having the address electrodes 511 and the display electrodes 512 lie at right angles each other, the first glass substrate 501 and the second glass substrate 502 are bonded face-to-face each other.

The discharge display section 510 is composed of a plurality of fluorescence discharging chambers 516. Arrangement is so made as to make up one pixel with an area, surrounded by a group of three fluorescence discharging chambers 516, i.e., the red fluorescence discharging chamber 516(R), the green fluorescence discharging chamber 516(G), and the blue fluorescence discharging chamber 516(B), among the plurality of fluorescence discharging chambers 516, and one counter display electrode.

The address electrodes 511 and the display electrodes 512 are connected to an AC power supply that is not illustrated in the figure. By electrifying each electrode, the fluorescent substance 517 gets excited in the discharge display section 510 for light emission to enable color-displaying operation.

In this exemplary embodiment, the bus electrode 512*a* and the address electrodes 511 are formed by the conductive film wiring forming method described in FIG. 1. Therefore, the bus electrode 512*a* and the address electrodes 511 are provided with high adhesiveness so that the likelihood of defective wiring is reduced. Moreover, since wiring alignment can be implemented with good accuracy, it becomes possible to materialize high-density wiring. In the situation, since the alignment mark is formed by droplet ejection, the manufacturing process becomes easier, for example, in comparison with a method in which the alignment mark is formed by photolithography technique, and consequently it also becomes possible to reduce the cost of manufacturing a device.

Furthermore, if the intermediate layer is made of a manganese compound (manganese oxide), the required electrical conductivity between the display electrodes 512 and the bus electrode 512*a* can be secured by making the manganese layer very thin and porous despite non-conductivity of the manganese oxide. Moreover, in this case, the intermediate layer becomes black and gets an effect as a black matrix to enable enhancement or improvement of the display contrast.

Next, a liquid crystal display device (LCD) is explained, as another example of an electro-optical apparatus of exemplary embodiments of the present invention.

Figure 7:
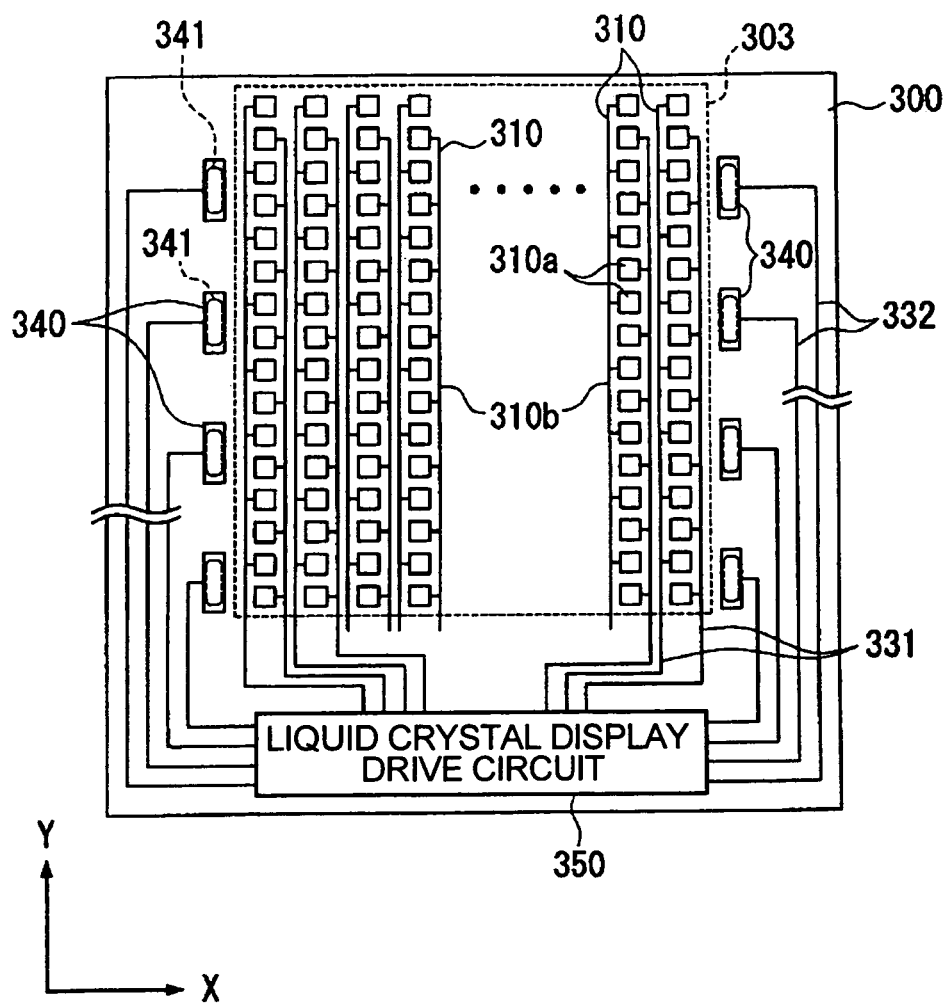
FIG. 7 is a plan view showing an example, in which an electro-optical apparatus of exemplary embodiments of the present invention are applied to a liquid crystal display device.

FIG. 7 is a schematic showing a plane layout of signal electrodes and so forth on a first substrate of a liquid crystal display device that relates to this exemplary embodiment.

In general, the liquid crystal display device relating to this exemplary embodiment includes; the first substrate, a second substrate (not illustrated in the figure) on which a scanning electrode and so on are placed, and LCD substance (not illustrated in the figure) sealed between the first and second substrates.

As FIG. 7 shows, a plurality of signal electrodes 310 are placed in multiple-matrix condition in a pixel area 303 on a first substrate 300. Particularly, each of the signal electrodes 310 include; a plurality of pixel electrode parts 310*a* placed for each pixel, and a signal wiring part 310*b* to connect thereof in multiple-matrix condition, while each of the signal electrodes 310 being extended in the Y-direction Meanwhile, a reference numeral 350 represents a liquid crystal display drive circuit of one-chip structure, and the liquid crystal display drive circuit 350 and one end (lower side of the figure) of the signal wiring part 310*b* are connected by a first route wiring 331.

Moreover, 340 represents an up-and-down conductive terminal, the up-and-down conductive terminal 340 and another terminal placed on the second substrate, which is not illustrated in the figure, are connected with an up-and-down conductive material 341. Furthermore, the up-and-down conductive terminal 340 and the liquid crystal display drive circuit 350 are connected by a second route wiring 332.

In this exemplary embodiment, the signal wiring part 310*b*, the first route wiring 331, and the second route wiring 332 all of which are placed on the first substrate 300, are formed by the conductive film wiring forming method described in FIG. 1. Therefore, high adhesiveness of the wiring can be realized and defective wiring is unlikely. Moreover, since wiring alignment can be implemented with good accuracy, it becomes possible to materialize high-density wiring. In the situation, since the alignment mark is formed by droplet ejection, the manufacturing process becomes easier, for example, in comparison with a method in which the alignment mark is formed by photolithography technique, and consequently it also becomes possible to reduce the cost of manufacturing a device.

Incidentally, devices to which exemplary embodiments of the present invention can be applied are not confined to these electro-optical apparatuses described above. Exemplary embodiment of the present invention can be applied to manufacturing other devices too, such as, for example, any circuit board in which conductive film wiring is formed, mount-wiring for semiconductors, and so on.

Next, a practical example of an electronic device relating to exemplary embodiments of the present invention is explained.

Figure 8:
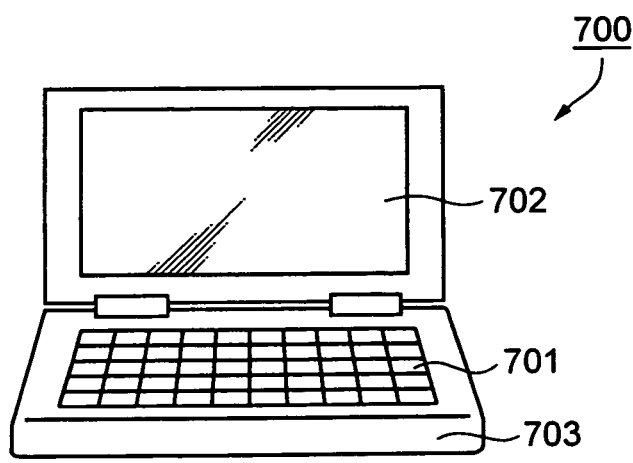
FIG. 8 is a schematic showing an example, in which an electronic device of exemplary embodiments of the present invention are applied to a portable-type data processing device equipped with a liquid crystal display device.

FIG. 8 is a schematic bird's-eye view illustrating an example of a portable-type data processing device such as a word processor, a personal computer, and so on.

In FIG. 8, 700 represents a data processing device, 701 is an input operation section, 703 indicates a data processing device main body, and 702 represents a liquid crystal display section equipped with a liquid crystal display device that FIG. 7 showed previously.

Since the electronic device shown in FIG. 8 is equipped with a liquid crystal display device of the exemplary embodiment described above, it has high adhesiveness in its wiring and any defective wiring is unlikely. Furthermore, it is possible to provide such an electronic device inexpensively.

Moreover, though the electronic device of this exemplary embodiment is described as being equipped with a liquid crystal display device, it can also be an electronic device equipped with another type of electro-optical apparatus such as an organic electroluminescent display device, a plasma display panel device, and so on Up to here, a preferred exemplary embodiment relating to the present invention is described while referring to the attached drawings. However, the exemplary embodiments of present invention are not confined to the exemplary embodiment described above, and it can be put into practice in various exemplary modifications that do not deviate from the concept of exemplary embodiments of the present invention.

For example, in the exemplary embodiment described above, the alignment mark forming process is set to be separate from the pattern forming process (i.e., intermediate layer forming process and material placement process). However, it is also possible to implement the alignment mark forming process as a part of the intermediate layer forming process. That is to say, when drawing on the substrate by using the second liquid material carried out in the intermediate layer forming process, the alignment mark can also be drawn at the same time. In such a case, the alignment mark is used as alignment measures to place the first liquid material onto the intermediate layer for sure in the next process, i.e., the material placement process.

Furthermore, in the exemplary embodiment described above, the wiring pattern has a two-layer structure including the intermediate layer and the conductive layer that become the wiring main body. However, the wiring pattern may be of a single-layer film, or any multiple-layer film having three or more layers. When the pattern is of any multiple-layer film having three or more layers, it is preferred that a film that has the highest adhesiveness to the substrate is placed as the first layer (i.e., at the closest position to the substrate). According to this arrangement, adhesiveness between the substrate and the pattern becomes high enough, and any defect due to peeling off and so on, is unlikely.

Incidentally, when a pattern composed of multiple layers, i.e., three or more layers, is formed in the manner as the above exemplary embodiment describes, it is suggested to form an alignment mark by drop ejection before forming a first layer film or a second layer film. Especially, if any positioning work and so on is not required at the time of installing a substrate into droplet ejection equipment, the alignment mark can be formed after or at the time of forming the first layer (i.e., before forming the second layer). Particularly, if the same material as the pattern forming material of the first layer is used for the alignment mark forming material and both the alignment mark forming and the first layer forming are implemented collectively in a single process, the total process can be simplified so as to ease the work and reduce or avoid any contamination.

Moreover, in the exemplary embodiment described above, a wiring pattern is used for explanation as an example for a pattern of exemplary embodiments of the present invention. However, application of exemplary embodiments of the present invention is not confined to such a wiring pattern, and exemplary embodiments of the present invention can also be applied to forming any other pattern besides such a wiring pattern.

Furthermore, the shapes, combinations, and so on of the structural components indicated in the exemplary example described above are just for example, and they can be modified according to design requirements and so forth in various manners that do not deviate from the exemplary embodiments of the present invention.

What is claimed is:

1. A method of forming a pattern composed of a laminated film of multiple kinds of pattern forming materials on a substrate, comprising:

laminating a liquid material including the multiple kinds of pattern forming materials, onto the substrate by means of droplet ejection;

placing a liquid material including an alignment mark forming material, onto the substrate by droplet ejection at least prior to a placement process of a second layer of a pattern forming material; and placing the second and subsequent layers of the pattern forming materials using a placed alignment mark, the pattern being a wiring pattern including laminated films of two kinds of pattern forming materials, in which a pattern forming material of a first layer positioned closer to a substrate side is composed of at least one of metal particles of manganese, chrome, nickel, titanium, magnesium, silicon, and vanadium; and particles containing oxide of the metal materials of the first layer; and a pattern forming material of a second layer being composed of at least one of metal particles of gold, silver, copper, palladium and nickel; and particles containing alloy of the metal materials of the second layer.

2. The method of forming a pattern according to claim 1, the alignment mark forming material and the pattern forming material being the same material.

3. The method of forming a pattern according to claim 1, further comprising:

positioning a material having a highest adhesiveness to the substrate among the multiple kinds of pattern forming materials, closest to the substrate.

4. The method of forming a pattern according to claim 1, further comprising:

using the same material for the pattern forming material of the first layer positioned closest to a substrate side for the alignment mark forming material; and implementing together placement of the alignment mark forming material and placement of the pattern forming material of the first layer in one manufacturing process.

5. The method of forming a pattern according to claim 1, any other substrate surface area except the area of pattern forming, being controlled by surface treatment before forming the pattern so as to exhibit liquid repellency against a liquid material including the pattern forming material.

6. A film structure, comprising:
a pattern formed by the method of claim 1.

7. An electro-optical apparatus, comprising:
a film structure as set forth in claim 6.

8. An electronic device, comprising:
an electro-optical apparatus as set forth in claim 7.

* * * * *